United States Patent [19]

Waugh

[11] Patent Number: 4,829,178

[45] Date of Patent: May 9, 1989

[54] APPARATUS FOR SURFACE ANALYSIS

[75] Inventor: Allen R. Waugh, East Grinstead, England

[73] Assignee: VG Instruments Group Limited, Crawley, England

[21] Appl. No.: 91,048

[22] Filed: Aug. 28, 1987

[30] Foreign Application Priority Data

Mar. 30, 1987 [GB] United Kingdom ................ 8707516

[51] Int. Cl.⁴ .......................................... H01J 37/252
[52] U.S. Cl. ................................... 250/309; 250/306; 250/310; 250/288
[58] Field of Search ............... 250/309, 310, 306, 288; 350/507, 520

[56] References Cited

U.S. PATENT DOCUMENTS 4,255,661  3/1981  Liebl ............................... 250/396 R
4,537,477  8/1985  Takagi et al. ...................... 250/310

FOREIGN PATENT DOCUMENTS 0088917   2/1983   European Pat. Off. .
3137568   5/1983   Fed. Rep. of Germany .
2173436  10/1973   France .
2463504   2/1981   France .
53-76887  7/1978   Japan ................................. 250/309
2004084A  3/1979   United Kingdom .
2002169B  1/1982   United Kingdom .
2138626A 10/1984   United Kingdom .

OTHER PUBLICATIONS

Steffens et al., J. Vac. Sci. Technol. A, vol. 3, No. 3. May/Jun. 1985, pp. 1322–1325.
Schueler et al, "Possibilities For A Laser-Induced Micro-Mass Analysis of Bulk Surfaces"-Scanning Electron Microscopy/1980/II, pp. 597–607.
F. Hillenkamp, "Laser-Induced Micromass Spectrometry of Bioorganic Molecules and Biological Specimens'-'-Soviet Journal Quantum Electron, 11(12), Dec. 1981, pp. 1614–1621.
R. Kaufmann, "The Present State of Laser Microprobe Mass Analysis (Lamma) As Applied to Biomedical Samples", Microbeam Analysis–1986, pp. 177–179.
Feigl et al., "Lamma 1000, A New Instrument For Bulk Microprobe Mass Analysis By Pulsed Laser Radiation'-'-International Journal of Mass Spectrometry and Ion Physics, 47 (1983), pp. 15–18.
Heinen et al., "Lamma 1000, A New Laser Microprobe Mass Analyzer For Bulk Samples"-International Journal of Mass Spectrometry and Ion Physics, 47 (1983), pp. 19–22.
H. Liebl, "Ion Optics For Surface Analysis"-Inst. Phys. Conf. Ser. No. 38 1978: Chapter 6, pp. 265–281.
H. Liebl, "Ion Microprobe Mass Analyzer"-Journal of Applied Physics, vol. 38, No. 13, Dec. 1967, pp. 5277–5283.
Eloy et al, "Geological Applications Of The Laser Probe Mass Spectrometer"-International Journal of Mass Spectrometry and Ion Physics, 47 (1983), pp. 39–42.

Primary Examiner—Bruce C. Anderson
Assistant Examiner—Jack I. Berman
Attorney, Agent, or Firm—Chilton, Alix & Van Kirk

[57] ABSTRACT

An apparatus adapted for the analysis of a surface of a sample and comprising: means for stimulating a region of said surface to emit charged particles; means for moving a light reflecting means in a substantially rectilinear fashion along an optical axis of a microscope to a position where it reflects an image of said region to said microscope; and means for moving an extraction electrode in a substantially rectilinear fashion in a direction substantially parallel to, or coincident with, said optical axis to a position where said charged particles pass through an aperture in said extraction electrode to a charged particle analyzer. The invention allows both the direction of extraction of charged particles, and the direction along which said surface is viewed, to be coincident and perpendicular to said surface.

21 Claims, 5 Drawing Sheets

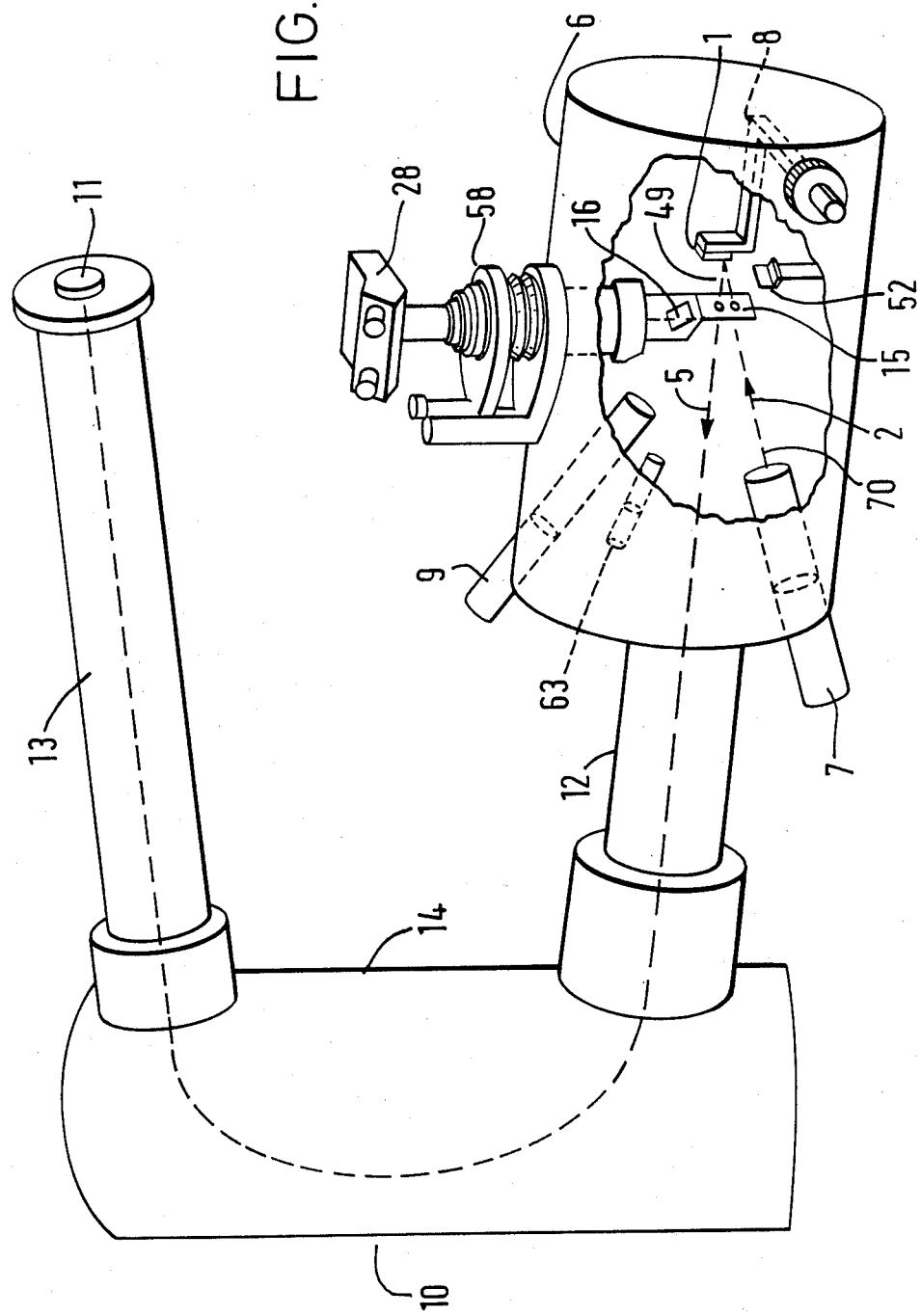

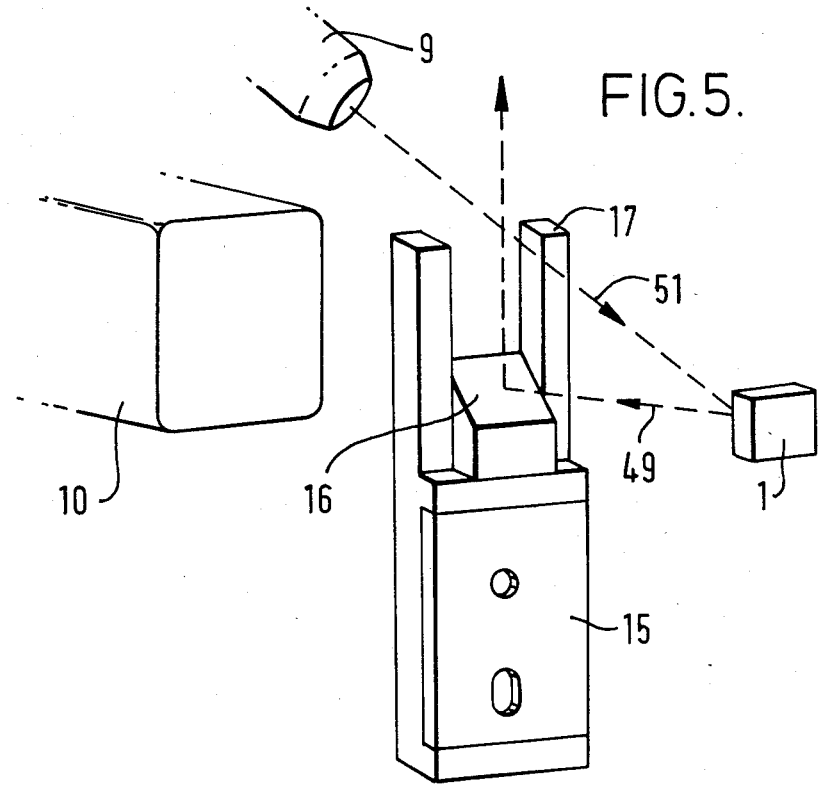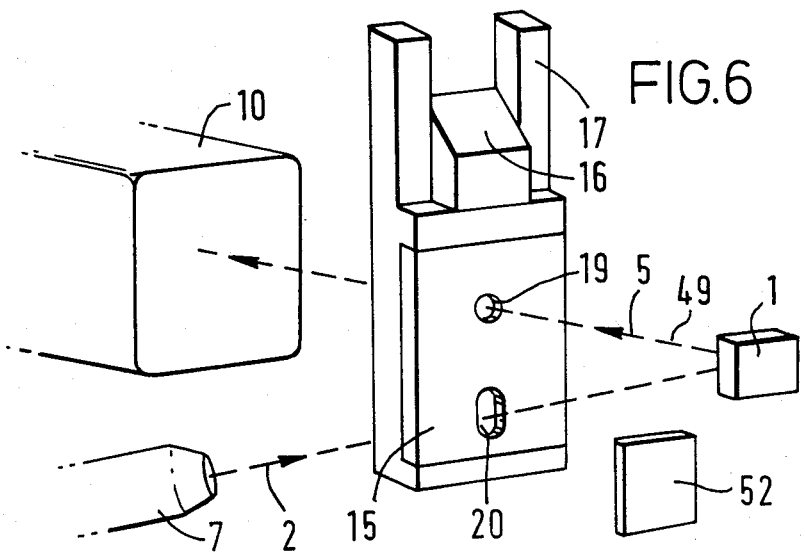

APPARATUS FOR SURFACE ANALYSIS

This invention relates to instruments for surface analysis particularly, though not exclusively, secondary ion mass spectrometers, and provides improved means for viewing and positioning samples for analysis.

A number of instruments for the analysis of the surface of a sample are based on the analysis of charged particles emitted in response to an external stimulus. In such instruments it is advantageous to be able to view the surface by light microscopy to identify regions of interest and to assist the positioning of these regions with respect to the particle analyzer. In secondary ion mass spectrometry (SIMS), in which secondary ions are analyzed after emission in response to primary ion impact, it is usual to collect the secondary ions from the surface by means of an extractions lens; the matter of positioning a sample is then to position the region of interest with respect to the extraction lens.

Several methods of viewing samples have been described. A general problem is to provide means to view the surface without restricting the pathways of primary radiation or secondary particle beams. Instruments in which laser radiation is the primary radiation may use elements of the laser optical system as part of the viewing optics. United Kingdom Patent Application No. 2004084 describes apparatus in which a sample is irradiated along an axis oblique to the surface, while emitted ions pass to a mass spectrometer disposed on an axis substantially perpendicular to the surface. A beam divider is placed in the path of the laser radiation, reflecting a view of the sample to an observation system. In the instrument described in German Patent Application No. 3137568 a sample is viewed and illuminated along axes inclined at 45° to the surface, and a beam divider is disposed in the viewing path to direct laser radiation along that path to the surface of the sample. Again, emitted ions are analyzed in a mass spectrometer which has its axis perpendicular to the surface. These instruments necessarily give an oblique view of the surface.

The instrument described in French Patent Application No. 2463504 does have means to direct laser radiation perpendicularly onto a sample and to give a corresponding view via substantially the same optical path. It is then necessary to deflect the emitted ions, in some cases through substantially 180°, around elements of the optical system towards the ion detector. Consequently the technique is not generally applicable, in particular it would not be appropriate in instruments which analyze ions according to their flight times because the deflection introduces differences in flight times for ions of the same mass.

Thin samples, typically biological specimens, may be viewed by transmitted light and may emit particles from the side opposite to that of primary radiation impact. For such samples, both the viewing and the analyzing means may be disposed on axes perpendicular to the surface of the sample, though on opposite sides of the sample. United Kingdom Patent Specification No. 2002169 describes apparatus in which a microscope is provided on one side of a sample, and on the opposite side is a movable mounting on which are fixed an illumination source and the ion collection optics of a time-of-flight analyzer. The mounting is moved to position the illumination source near to the sample when it is to be viewed through the microscope. To analyze the sample the ion optics are positioned near to the sample and the microscope is used to collimate laser radiation onto it; ions emitted from the side opposite to that of laser impact are collected by the ion optics and continue to an analyzer. Clearly such apparatus is suitable only for samples thin enough to be viewed by transmitted light and from which ions can be produced as described.

European Patent Application No. 0088917 describes a laser microprobe, for the analysis of a bulk sample, in which the sample may be moved relative to viewing optics and ion optics. The instrument has a viewing position in which an observation lens is on an axis perpendicular to the surface, and a measuring position in which the ion optics is on an axis perpendicular to the surface. In one version of the apparatus the sample is mounted on a turntable which is rotated to transfer between viewing and measuring positions; though clearly the provision of a turntable constrains the design of an instrument and may not be appropriate in particular applications. In an alternative version the sample is fixed and the viewing and ion optics are positioned on a movable slide, which is U-shaped to accommodate the positioning of various components. For viewing, an observation lens is positioned near to the sample, on an axis perpendicular to the sample's surface and then reflected light travels through the lens, along a path through cavities within the U-shaped slide, via reflections in several mirrors within the slide, to a microscope. Alternatively, to analyze the sample, part of the ion optics is placed near to the sample, on a perpendicular axis, and laser radiation is then reflected towards, and focussed upon, the surface where it is incident at an oblique angle. The surface may also be viewed in this analyzing position, using the laser optics, although this will necessarily give an oblique view. This apparatus does provide perpendicular viewing and analyzing positions, but has the disadvantage of complexity, particularly in the U-shaped path necessarily traversed by light reflected in the viewing position.

Apparatus has also been described for surface analytical instruments which do not comprise laser optics, and in which there must be independent viewing means. In the apparatus of French Patent Specification No. 2173436 a beam of electrons is directed through a tube, perpendicularly towards a sample and X-rays are then extracted, at an oblique angle. The surface is viewed using two mirrors, each with a central hole and mounted coaxially with the electron flight-tube. One mirror is concave and faces the sample, the other mirror is convex, faces away from the sample but is nearer to the sample. By this arrangement, known generally as a Cassegrain objective, an image of the sample is reflected by the concave mirror, to the convex mirror and then along the electron flight tube (in a direction opposite to that of the electrons) to be further reflected in at least one plane mirror to a microscope; this pathway is also used in reverse to illuminate the sample. Although this apparatus does allow viewing and irradiation of a sample along an axis perpendicular to the sample, it does not provide for the collection of secondary particles emitted in a direction substantially perpendicular to the surface. An objective comprising mirrors is also used in the apparatus of United Kingdom Patent Application No. 2138626 in which secondary particles are extracted perpendicularly from the surface through apertures in the mirrors. In that apparatus laser radiation is directed onto the sample from a source at right angles to the direction of extraction, via a plane mirror disposed between the two mirrors and facing the convex mirror.

A similar arrangement is described by H Liebl in the Institute of Physics Conference Series No. 38, 1978, Chapter 6 pages 266 to 281.

In the SIMS microprobe described by H Liebl in the Journal of Applied Physics, volume 38, number 13, 1967, pages 5277 to 5283, primary ions are directed perpendicularly towards a surface and a mirror is located at the exit of the ion gun, facing the surface and angled at 45° to it; the primary ions leave the gun through a hole in the mirror. The mirror reflects an image of the surface to a microscope which has its optical axis at 90° to the primary ion path. Secondary ions are extracted from the surface in a direction at an angle of less than 90°. This arrangement is restricted to apparatus having similar geometry.

In summary disadvantages of known techniques for viewing a sample in instruments for surface analysis are that: (a) they do not allow a sample to be viewed on an axis perpendicular to the surface, or (b) they do not have means both to view and analyze secondary particles along a perpendicular axis—which if it were done would provide a high quality view corresponding to the emission region, or (c) they are inconveniently complex, or (d) while they may be suitable for analysis by primary laser radiation, they do not conveniently allow microanalysis by primary ion beams.

It is the object of this invention, therefore, to provide an apparatus for the analysis of a sample, particularly but not exclusively by techniques comprising primary ion bombardment, in which charged particles are extracted from a region of the surface of said sample and which has improved and simplified means of viewing said region by optical microscopy.

According to this invention there is provided an apparatus adapted for the analysis of a surface of a sample and comprising: means for stimulating a region of said surface to emit charged particles, a charged particle analyzer, a sample manipulator, means for illuminating said surface, a microscope having an optical axis, a light reflecting means, and an extraction electrode having an extraction aperture; and characterised by also comprising:

means for moving said light reflecting means in a substantially rectilinear fashion along said optical axis to a position between said surface and said charged particle analyzer, whereby said light reflecting means reflects an image of said region to said microscope; and means for moving said extraction electrode in a substantially rectilinear fashion in a direction substantially parallel to, or substantially coincident with, said optical axis, thereby positioning said extraction aperture between said surface and said charged particle analyzer, whereby said charged particles pass from said region, through said extraction aperture, towards said charged particle analyzer.

In preferred embodiments said light reflecting means and said extraction electrode are attached to a supporting member and a second manipulator is provided for moving said supporting member, in a substantially rectilinear fashion in a direction substantially parallel to, or substantially coincident with, said optical axis to a first position and alternatively to a second position, of which:

in said first position, said light reflecting means is disposed between said surface and said charged particle analyzer, and reflects an image of said region along said optical axis to said microscope; and in said second position, said extraction aperture is disposed between said surface and said charged particle analyzer, and said charged particles pass from said region, through said extraction aperture, towards said charged particle analyzer.

The direction in which charged particles pass from said region to the extraction aperture, and the direction of the image light to the light reflecting means, may both be substantially perpendicular to the sample surface.

The first position of the supporting member is to be known as the viewing position of the apparatus, and the second position of the supporting member is to be known as the analyzing position of the apparatus. It will be appreciated that the apparatus is provided with a vacuum chamber in which are contained, for example, the sample, the supporting member, the extraction electrode and the light reflecting means.

Also in a preferred embodiment the second manipulator comprises a connecting member, which is capable of substantially rectilinear, translational movement in a direction substantially parallel to, or substantially coincident with the optical axis of the microscope; the connecting member has a first end outside the vacuum chamber and a second end inside the vacuum chamber. Preferably the supporting member to which the light reflecting means and extraction means are affixed, is itself fixed to the second end of the connecting member, for example by means of a clamp.

Suitable means are provided for moving the connecting member, for example a movable arm may be fixed to the first end thereof. Preferably the movable arm is also located on a guiding member attached to a support block external to the vacuum chamber; the support block being attached, via suitable flanges for example, to a wall of the vacuum chamber. Also in a preferred embodiment the movable arm is constrained to move between two extreme positions, conveniently determined by contact between a pin attached to the movable arm and stopping means attached to the support block. Also there is provided a bellows, one end of which is joined, for example by suitable flanges, to the first end of the connecting member, and the other end of which is joined, again by suitable flanges for example, to a wall of the vacuum chamber. The linear movement of the connecting member is accommodated by compression and expansion of the bellows.

The two extremes of movement of the movable arm, determine two extremes of movement of the connecting member: one extreme of movement of the arm corresponds to the first position of the supporting member, and hence the viewing position of the apparatus; the other extreme of movement of the arm corresponds to the second position of the supporting member, and hence the analyzing position of the apparatus.

The microscope, which may be either monocular or binocular, comprises a head assembly, a microscope tube and an objective element; the head assembly comprises the eyepiece or eyepieces of the microscope. The objective element preferably comprises at least one refracting lens, or alternatively it may comprise a plurality of reflectors as of the type known as a Cassegrain objective, for example.

In a preferred embodiment the connecting member of the second manipulator comprises a hollow connecting tube and the objective element of the microscope is disposed within, or at either end of, the connecting tube; preferably the connecting tube is sealed by a window, which may be at least part of the objective element. In a further preferred embodiment the microscope comprises a microscope tube, in which is disposed the objective element, and that microscope tube is itself disposed inside the hollow connecting tube which is sealed by a window. At least one of the faces of the window is half-silvered, by coating with electrically conducting material, in order to avoid the accumulation of electrostatic charge which otherwise could distort the trajectory of primary or secondary charged particles.

The light reflecting means may conveniently comprise a mirror, or alternatively a prism. In a preferred embodiment of the invention, a substantially plane mirror is fixed to the supporting member, disposed on the optical axis of the microscope with the reflecting face of the mirror at substantially 45° to the optical axis; in the viewing position of the apparatus the light reflecting means reflects a view of the surface towards the objective element of the microscope.

Preferably, the means for stimulating said region of the surface of the sample to emit charged particles is a primary beam source, in which case the emitted charged particles are properly termed secondary particles, of which secondary ions are of particular interest. Preferably the primary beam comprises primary ions, or alternatively neutral particles, electrons or laser radiation. Means are also provided to apply an extraction voltage between the sample and the extraction electrode, thereby creating an extraction field in which said secondary ions are accelerated from said region. In a preferred embodiment the charged particle analyzer comprises a time-of-flight analyzer, and as required for time-of-flight analysis the secondary ions are caused to be emitted in pulses by, for example pulsing the primary beam; alternatively the primary beam may be constant and the extraction voltage may be pulsed. In alternative embodiments the charged particle analyzer may comprise a magnetic sector analyzer or a quadrupole analyzer.

In an especially preferred embodiment of the apparatus there is provided a secondary ion mass spectrometer adapted for the analysis of a sample surface and comprising: an ion source, providing a pulsed primary ion beam for stimulating a region of said surface to emit secondary ions, and a time-of-flight mass analyzer for analyzing said secondary ions; preferably said time-of-flight mass analyzer comprises an energy-focussing electrostatic analyzer.

An advantage of the present invention is that the observation optics, comprising the microscope and light reflecting means, can be used to position the sample so that a chosen region is positioned for analysis by, for example, a primary ion beam. A further advantage derives from the simplification over known apparatus in that the extraction electrode and light reflecting means both move on, or parallel, to the optical axis of the microscope.

It is convenient, for the purposes of further explanation, to define a "secondary ion axis" which is a straight line drawn from the stimulated region of the surface and along which, when the apparatus is in the analyzing position, the secondary ions travel towards the extraction aperture and from there to the charged particle analyzer. When the supporting member is moved so that the apparatus is in the viewing position the point of intersection of the secondary ion axis with the optical axis of the microscope lies substantially on the reflecting face of the mirror. In this way a view of the stimulated region is reflected towards the microscope. The correspondence between part of the optical path and part of the secondary ion path, i.e. the secondary ion axis, ensures that a region can be selected, and viewed, microscopically and then analyzed after linearly moving the supporting member along the optical axis.

In a preferred embodiment of the invention the extraction electrode has, in addition to the extraction aperture, a primary radiation aperture through which radiation may be directed to stimulate said region on the surface of the sample; preferably the extraction electrode has a primary ion aperture through which primary ions are directed towards said region. In a further preferred embodiment the extraction electrode has a plurality of apertures for the purposes of allowing the passage of primary radiation or secondary ions through the extraction electrode. For example, in addition to the extraction aperture and the primary ion aperture there may be a primary electron aperture to allow electrons to be directed towards the surface, as may be used to neutralise accumulated positive charge during the study of insulators. Also the apparatus may comprise a plurality of ion guns, disposed on axes at various angles to the surface of the sample and there will correspondingly be a plurality of primary ion apertures. Also, in addition to said charged particle or mass analyzer, which is provided as the principal means of analyzing secondary particles emitted along the secondary-ion axis defined above, there may also be provided at least one off-axis analyzer and hence at least one off-axis aperture to allow secondary particles to pass through the extraction electrode towards the off-axis analyzer; the off-axis analyzer may, for example, be a quadrupole mass analyzer. Hence the extraction electrode may comprise a plurality of apertures to serve a plurality of charged particle analyzers.

Also in a preferred embodiment the apparatus comprises a deflection electrode disposed near to the sample and the extraction electrode, and means for applying a voltage to said deflection electrode thereby producing an electric field as may be required to deflect the primary ion beam onto the surface of the sample; in the absence of this deflection the trajectory of the primary ions may be distorted by the extraction field.

Preferred embodiments of the invention will now be described in greater detail by way of example and with reference to the figures in which:

FIG. 2 illustrates a secondary ion mass spectrometer according to the invention and incorporating an energy focussing, time-of-flight mass analyzer;

FIGS. 5 and 6 illustrate schematically some aspects of the operation of the spectrometer.

Figure 1:
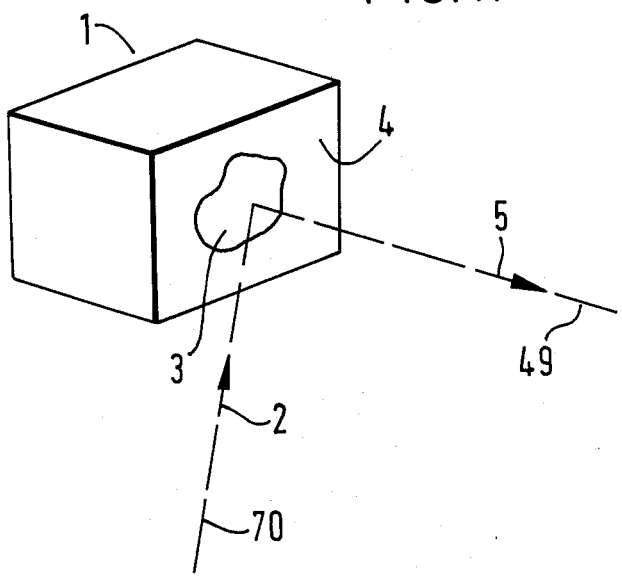
FIG. 1 illustrates a sample under primary ion bombardment.

Referring first to FIG. 1, there is shown a sample 1 with primary ions 2 travelling along a primary ion axis 70 to strike a region 3 of a surface 4, and secondary ions 5 leaving region 3, travelling along a secondary ion axis 49.

Referring next to FIG. 2, there is shown an apparatus adapted for the analysis of the surface of a sample, which is a secondary ion mass spectrometer comprising a vacuum chamber 6, a primary ion gun 7, sample 1, a sample manipulator 8, a deflector plate 52, an illumination means 9, a charged particle analyzer which is a time-of-flight mass analyzer 10 and a secondary ion detector 11. Mass analyzer 10 comprises flight tubes 12 and 13, and an electrostatic energy focussing analyzer 14. The spectrometer also comprises a viewing and extraction assembly 58 which is discussed in detail below. Also shown in FIG. 2 is an off-axis analyzer 63 which is a quadrupole mass analyzer, separate and distinct from mass analyzer 10.

The apparatus has an analyzing position and a viewing position, by which region 3 of surface 4 may be analyzed or viewed, respectively. In FIG. 2 the apparatus is shown in its analyzing position in which, as will be described, primary ions 2 are directed in a pulsed beam from primary ion gun 7, along primary ion axis 70, towards region 3, and secondary ions 5 travel, along secondary ion axis 49, from region 3 towards mass analyzer 10, thence to ion detector 11.

Figure 3:
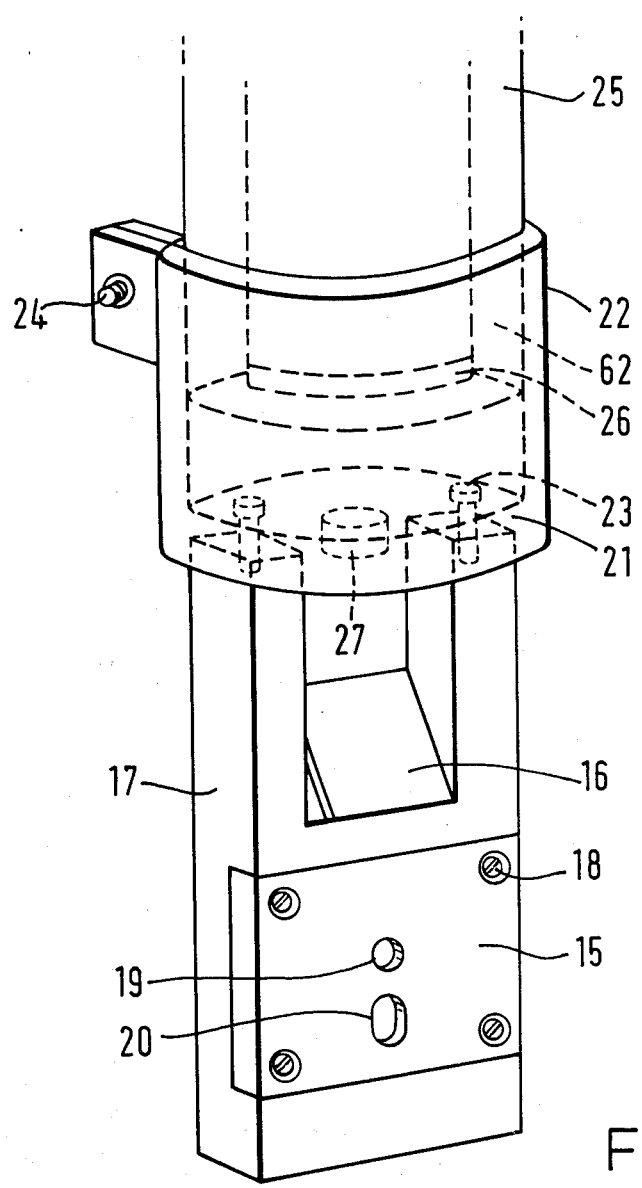
FIG. 3 illustrates details of the extraction electrode and light reflecting means.

Referring now to FIG. 3, there is shown an extraction electrode 15 and a light reflecting means which is a front-silvered plane mirror 16, both fixed to a supporting member 17. Extraction electrode 15 is fixed to supporting member 17 by screws 18, and has an extraction aperture 19 and a primary ion aperture 20, as shown. Supporting member 17 is fixed to base 21 of a clamp 22 by screws 23. In turn clamp 22 is clamped, and held by nut-and-bolt 24, around second end 62 of a connecting member 68 (FIG. 4); in this preferred embodiment connecting member 68 (FIG. 4) comprises a hollow connecting tube 25 and a flange 31 (FIG. 4), and in FIG. 3 only part of tube 25 is shown. Tube 25 is sealed by a window 26. A hole 27 in base 21 allows light reflected from mirror 16 to travel towards window 26.

Figure 4:
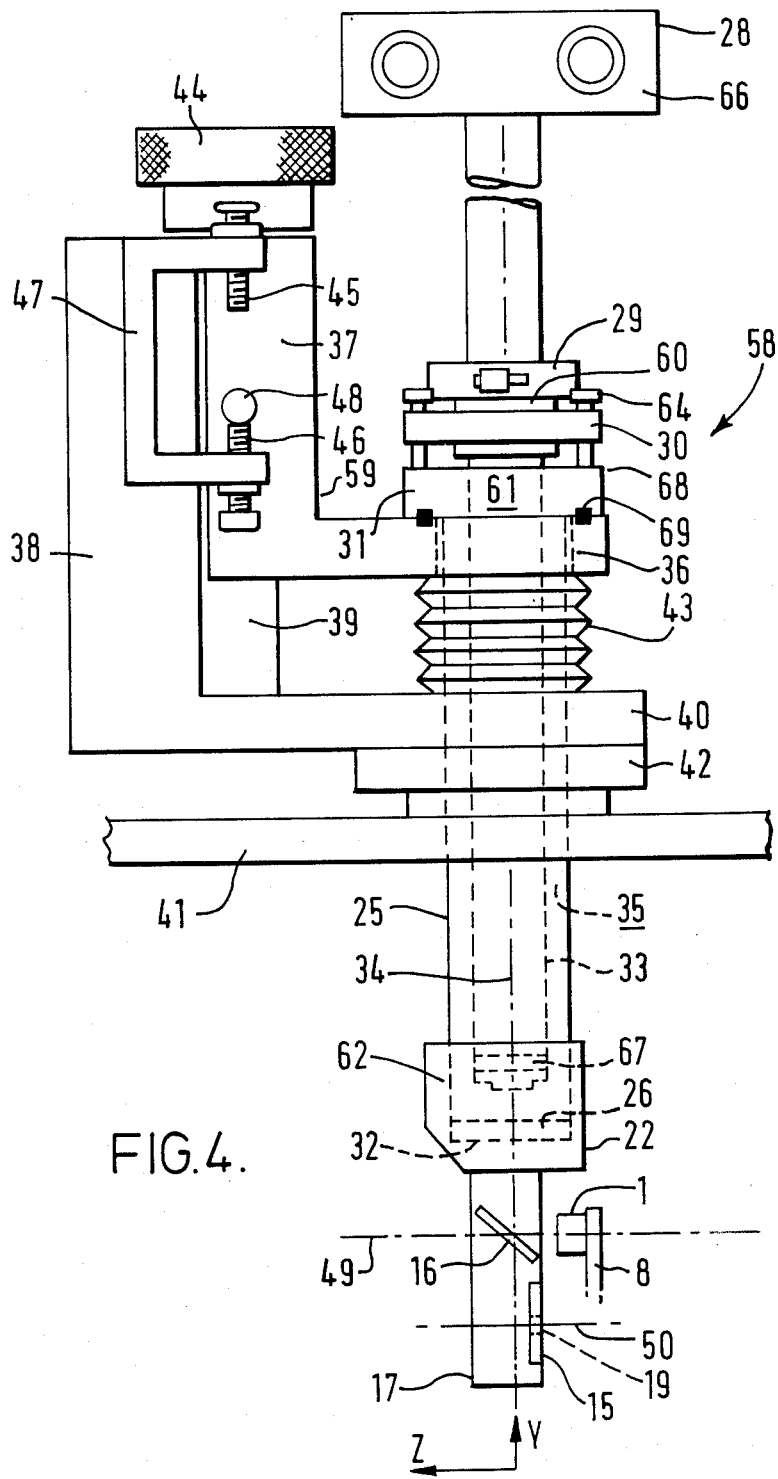
FIG. 4 illustrates further details of certain components of the spectrometer.

Referring next to FIG. 4 there is shown viewing and extraction assembly 58 in greater detail than in FIG. 2. A second manipulator 59 comprises a movable arm 37, a flange 36, connecting member 68 and clamp 22; connecting member 68 has a first end 61 and second end 62, comprises connecting tube 25 and also comprises flange 31 at first end 61. Second manipulator 59 is used to move supporting member 17. A binocular microscope 28 comprises a head assembly 66, a microscope tube 33 and an objective element 67 which is a conventional refracting lens. Microscope tube 33 projects through a kinematic mount 30 and flange 31 into connecting tube 25, and is clamped to an annular projection 60 of mount 30 by a circumferential clamp 29. The orientation of microscope tube 33 within connecting tube 25 may be adjusted by means of screws 64 which control the attitude of mount 30 with respect to flange 31. There is a conventional vacuum seal 69 (comprising a soft metal 'O'-ring for example), indicated schematically on FIG. 4, between flange 31 and flange 36, which are bolted together. The space 35 between microscope tube 33 and connecting tube 25 is not evacuated; tube 33 is sealed by window 26 and seal 69 as described. Window 26 is half-silvered on its side 32 (the side nearest to mirror 16) to prevent the accumulation of elecrostatic charge.

Also shown on FIG. 4 is a support block which comprises a pillar 38, a guiding member 39 and a flange 40. The support block is fixed to a wall 41 of chamber 6 (FIG. 2) by bolts (not shown) joining flange 40 to a flange 42. A conventional vacuum bellows 43, as manufactured for example by Vacuum Generators Ltd of East Sussex, England, is welded to flanges 40 and 36 as shown.

In order to describe the operation of viewing and exraction assembly 58 it is convenient to define a Y-axis (along an optical axis 34 of microscope 28), a Z-axis (in the plane of FIG. 4 as shown) and an X-axis (perpendicular to and out of the plane of FIG. 4) forming a conventional right-handed co-ordinate system. In this preferred embodiment of the invention the Y-axis, i.e. axis 34 of microscope 28 is substantially vertical.

Movement of arm 37 in the Y-direction is controlled by means of a knob 44, which is attached to a threaded shaft (not shown) running on a threaded column (not shown) within a pillar 38; in this way arm 37 can be raised or lowered. The upper and lower limits of travel of arm 37 are controlled by stopping means comprising stop screws 45 and 46, which are located in threaded holes in a bracket 47 (fixed to pillar 38), in conjunction with a pin 48 which is fixed to arm 37. FIG. 4 shows the viewing and extraction assembly 58 in its lower position, with pin 48 in contact with screw 46 and with bellows 43 compressed. Alternatively, arm 37 may be raised, expanding bellows 43, to the upper limit of travel of arm 37 as determined by contact between pin 48 and screw 45.

When assembly 58 is in the lower position, mirror 16 (which is disposed at 45° to optical axis 34) is disposed at the intersection of optical axis 34 and the secondary-ion axis 49. Hence mirror 16 reflects an image of region 3 of surface 4 (FIG. 1) to microscope 28; this lower position of assembly 58 is the viewing position of the apparatus. Preferably the microscope is provided with cross-wires (not shown) to aid viewing and positioning of the region of interest on the sample surface.

When assembly 58 is in the upper position, extraction aperture 19 lies on axis 49 and secondary ions 5 (FIG. 1) may pass from sample 1 to mass analyzer 11, as will be described below with reference to FIGS. 5 and 6. Hence, the upper position of assembly 15 is the analyzing position of the apparatus. Screws 45 and 46 are adjusted to ensure that the distance of travel of arm 37, between its lower and upper positions, equals the distance in the Y-direction between the centre-line 50 of extraction aperture 19 and axis 49; i.e. the distance in the Y-direction through which extraction aperture 19 must be moved to lie on axis 49.

Referring next to FIG. 5 there is shown schematically the operation of the apparatus in the viewing position. Surface 4 (FIG. 1) of sample 1 is illuminated by light 51 from the illumination means 9. Illumination means 9 comprises a fibre optic light guide in the preferred embodiment of the invention. An image of region 3 (FIG. 1), conveniently located by cross-wires in microscope 28, is reflected by mirror 16 to microscope 28 (FIG. 4).

Referring next to FIG. 6 there is shown, schematically the operation of the apparatus in the analyzing position. Region 3 of surface 4 (FIG. 1) is irradiated by primary ions 2 from ion gun 7; ions 2 pass through aperture 20 in extraction electrode 15. In order to accelerate secondary ions 5 towards electrode 15, electrode 15 is earthed and sample 1 is maintained at a voltage of approximately $+5$ kV or $-5$ kV. Hence secondary ions 5 pass from region 3, along axis 49, through extraction aperture 19, and continue towards mass analyzer 10. Deflector plate 52 is provided to assist in directing primary ions 2 onto region 3, particularly to counteract any deflection caused by the voltage applied to sample 1. The position of sample 1, and hence region 3 of surface 4, with respect to mass analyzer 10 is the same in the viewing position (FIG. 5) as in the analyzing position (FIG. 6).

Figure 7:
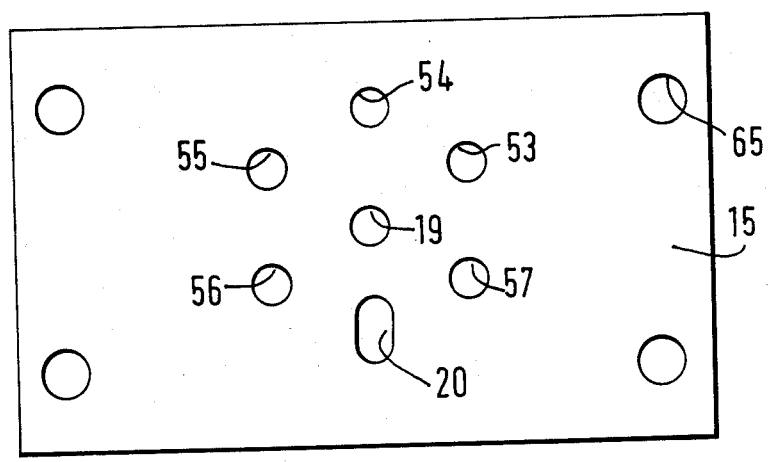
FIG. 7 illustrates an alternative version of the extraction electrode.

Referring next to FIG. 7 there is shown an alternative form of extraction electrode 15, which has a plurality of apertures 53, 54, 55, 56 and 57 in addition to extraction aperture 19 and primary ion aperture 20. Apertures 53, 54, 55, 56 and 57 are intended to be used either to allow further rays to be incident upon surface 4 (FIG. 1), or to allow the extraction of secondary ions in an alternative direction to that leading to analyzer 10. For example, aperture 53 may be used to allow the passage of an electron beam onto surface 4 (FIG. 1), as may be adavntageous in the analysis of insulating samples. Aperture 54 may be part of an illumination path, as an alternative to that shown in FIG. 5. Aperture 56 may be part of an alternative path for primary ions. Moreover secondary ions may be extracted, for example, through aperture 57 to an alternative analyzer other than analyzer 10, which may be advantageous if for example a quadrupole analyzer 63 were provided in addition to time-of-flight analyzer 10. Holes 65 are to take screws 18 (FIG. 3).

It will be appreciated that the apparatus comprises power supplies and control units not shown in the figures, and that pumps are provided to obtain high and ultra-high vacuum conditions as required. Also, means may be provided to scan the beam of primary ions 2 across surface 4, synchronously detecting secondary ions 5 to obtain a two-dimensional image.

I claim:

1. In apparatus for the analysis of a surface of a sample, said apparatus including means for stimulating a region of said surface to emit charged particles, a charged particle analyzer, a sample manipulator, means for illuminating said surface, a microscope having an optical axis, a light reflecting means, and and extraction electrode having an extraction aperture, the improvement comprising:
    means for moving said light reflecting means along said optical axis whereby said light reflecting means may be selectively located at a first position between said surface and said charged particle analyzer and said light reflecting means will reflect an image of a region of said surface to said microscope; and
    means for moving said extraction electrode to selectively locate said extraction electrode generally at said first position between said surface region and said charged particle analyzer whereby said charged particles emitted from said region are directed through said extraction aperture towards said charged particle analyzer.

2. An apparatus as claimed in claim 1 wherein the direction in which said charged particles travel from said region of said surface to said extraction aperture and the direction of light reflected from said region of said surface to said light reflecting means are both substantially perpendicular to said sample surface.

3. Apparatus for the analysis of a sample comprising:
    means for stimulating a region of the surface of the sample to thereby cause the emission of charged particles;
    a charged particle analyzer;
    a sample manipulator;
    means for illuminating the surface of the sample to be stimulated;
    a microscope having a optical axis;
    a light reflecting means;
    an extraction electrode having an extraction aperture;
    common support means for said light reflecting means and said extraction electrode; and
    a second manipulator for moving said support means in a direction generally parallel to said optical axis between a first position and a second position, said light reflecting means being disposed between said surface region and said charged particle analyzer when said support means is in said first position whereby an image of said region will be reflected along said optical axis to said to said microscope, said extraction aperture being disposed between said surface region and said charged particle analyzer when said support means is in said second position whereby said charged particles will pass from one said region, through said extraction aperture, towards said charged particle analyzer.

4. An apparatus as claimed in claim 3 wherein the direction in which said charged particles travel from said region of said surface to said extraction aperture and the direction of light reflected from said region of said surface to said light reflecting means are both substantially perpendicular to said sample surface.

5. An apparatus as claimed in claim 3 in which said light reflecting means comprises a mirror having a reflecting face, said mirror being fixed to said support means and being disposed on said optical axis of said microscope with said reflecting face oriented at substantially 45° to said optical axis.

6. An apparatus as claimed in claim 3 in which said second manipulator comprises a connecting member, capable of substantially rectilinear, translational movement in a direction substantially parallel to, or substantially coincident with said optical axis of said microscope; said microscope comprises an objective element; and in which said connecting member comprises a hollow connecting tube and said objective element of said microscope is disposed within, or at either end of, said connecting tube.

7. An apparatus as claimed in claim 3 in which said second manipulator comprises a connecting member, capable of substantially rectilinear, translational movement in a direction substantially parallel to, or substantially coincident with said optical axis of said microscope; said microscope comprises a microscope tube with an objective element disposed within said microscope tube; said connecting member comprises a hollow connecting tube sealed by a window; and said microscope tube is disposed inside said hollow connecting tube.

8. An apparatus as claimed in claim 3 comprising a vacuum chamber in which are contained at least said sample, said support means, said extraction electrode and said light reflecting means; in which said second manipulator comprises a connecting member, which is capable of substantially rectilinear, translational movement in a direction substantially parallel to, or substantially coincident with said optical axis of said microscope; said connecting member having a first end outside said vacuum chamber and a second end inside said vacuum chamber; said support means being fixed to said second end of said connecting member; said apparatus also comprising a movble arm fixed to said first end of said support means, said movable arm being located on a guiding member attached to a support block external to said vacuum chamber; said support block being attached to a wall of said vacuum chamber; and in which said movable arm is constrained to move between two extreme positions determined by contact between a pin attached to said movable arm and stopping means attached to said support block; and also in which there is provided provided a bellows, one end of which is joined to said first end of said connecting member, and the other end of which is joined to a wall of said vacuum chamber.

9. An apparatus as claimed in claim 8 in which said light reflecting means comprises a mirror having a reflecting face, and in which said mirror is fixed to said support means, disposed on said optical axis of said microscope with said reflecting face at substantially 45° to said optical axis.

10. An apparatus as claimed in claim 3 in which said extraction electrode has a plurality of apertures for the purposes of allowing the passage of primary radiation to, or secondary radiation from, said surface.

11. An apparatus as claimed in claim 3 wherein said means for stimulating comprises and ion source which provides a pulsed primary ion beam for stimulating said region of said surface to emit secondary ions; and wherein said charged particle analyzer comprises a time-of-flight mass analyzer for anlayzing said secondary ions.

12. An apparatus as claimed in claim 11 and also comprising a deflection electrode disposed near to said sample and said extraction electrode, and means for applying a voltage to said deflection electrode, thereby producing an electric field as may be required to deflect said primary ion beam onto said surface of said sample, counteracting any deflection in the trajectory of said primary ions caused by said extraction field.

13. A secondary ion mass spectrometer adapted for the analysis of a sample surface and comprising: an ion source, providing a pulsed primary ion beam for stimulating a region of said surface to emit secondary ions, a time-of-flight mass analyzer for analyzing said secondary ions, a sample manipulator, means for illuminating said surface, a microscope having an optical axis, a light reflecting means, an extraction electrode having an extraction aperture, and means for applying an extraction voltage between said sample and said extraction electrode, thereby creating an extraction field in which said secondary ions are accelerated from said region; wherein said light reflecting means and said extraction electrode are both attached to a supporting member; and also a second manipulator is provided to move said supporting member, in a substantially rectilinear fashion in a direction subtantially parallel to, or substantially coincident with, said optical axis to a first position and alternatively to a second position, of which:

in said first position, said light reflecting means is disposed between said surface and said mass analyzer, and reflects an image of said region along said optical axis to said microscope, and in said second position, said extraction aperture is disposed between said surface and said mass analyzer, and said secondary ions pass from said region, through said extraction aperture, towards said mass analyzer.

14. A spectrometer as claimed in claim 13 wherein the direction in which said charged particles pass from said region of said surface to said extraction aperture, and the direction of image light to said light reflecting means, are both substantially perpendicular to said sample surface.

15. A spectrometer as claimed in claim 13 in which said second manipulator comprises a connecting member, capable of substantially rectilinear, translational movement in a direction substantially parallel to, or substantially coincident with said optical axis of said microscope, and comprising a hollow connecting tube sealed by a window; also in which said microscope comprises a microscope tube with an objective lens disposed within said microscope tube; and said microscope tube is disposed inside said hollow connecting tube.

16. A spectrometer as claimed in claim 15 in which said supporting member is fixed to said connecting member, and in which said light reflecting means comprises a mirror having a reflecting face with said reflecting face disposed on said optical axis at substantially 45° to said optical axis.

17. A spectrometer as claimed in claim 13 and in which said extraction electrode has, in addition to said extraction aperture, at least one further aperture for the purpose of allowing the passage of primary radiation to, or secondary radiation from, said surface.

18. A spectrometer as claimed in claim 13 and in which said extraction electrode has, in addition to said extraction aperture, a primary ion aperture through which said primary ions may be directed to stimulate said region of said surface.

19. A spectrometer as claimed in claim 13 and also comprising a deflection electrode disposed near to said sample and said extraction electrode, and means for applying a voltage to said deflection electrode, thereby producing an electric field as may be required to deflect said primary ion beam onto said surface of said sample, counteracting any deflection in the trajectory of said primary ions caused by said extraction field.

20. A spectrometer as claimed in claim 13 in which said light reflecting means comprises a mirror having a reflecting face disposed on said optical axis, at substantially 45° to said optical axis, and in which there is defined a "secondary ion axis" which is a straight line drawn from said stimulated region of said surface, and along which: in said second position of said supporting member said secondary ions travel from said region towards said extraction aperture; and in said first position of said supporting member the point of intersection of said secondary ion axis with said optical axis lies on said reflecting face.

21. A spectrometer as claimed in claim 13 in which said mass analyzer comprises an energy-focussing electrostatic analyzer.

* * * * *